United States Patent
Khanolkar et al.

(10) Patent No.: US 9,035,422 B2
(45) Date of Patent: May 19, 2015

(54) MULTILAYER HIGH VOLTAGE ISOLATION BARRIER IN AN INTEGRATED CIRCUIT

(71) Applicant: Texas Instruments Incorporated, Dallas, TX (US)

(72) Inventors: Vijaylaxmi Khanolkar, Santa Clara, CA (US); Anindya Poddar, Sunnyvale, CA (US); Randall Walberg, Campbell, CA (US); Giovanni Frattini, Travaco' Siccomario (IT); Roberto Giampiero Massolini, Giussago (IT)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/025,807

(22) Filed: Sep. 12, 2013

(65) Prior Publication Data

US 2015/0069572 A1    Mar. 12, 2015

(51) Int. Cl.
*H01L 29/00* (2006.01)
*H01F 27/28* (2006.01)
*H01L 49/02* (2006.01)

(52) U.S. Cl.
CPC ............ *H01F 27/2804* (2013.01); *H01L 28/10* (2013.01); *H01F 2027/2809* (2013.01)

(58) Field of Classification Search
CPC ..... H01L 23/5227; H01L 28/10; H01L 27/08; H01L 2924/3011
USPC .................................................. 257/277, 531
See application file for complete search history.

(56) References Cited

U.S. PATENT DOCUMENTS 8,436,709 B2 * 5/2013 Fouquet et al. ............... 336/200
8,674,418 B2 * 3/2014 Poddar et al. ................. 257/294

OTHER PUBLICATIONS

"Non-haloganated Low CTE BT Resin Laminate for IC Plastic Packages", MGC Mitsubishi Gas Chemical Company, Inc., pp. 1-5, available at www.jgc.co.jp/eng/products/lm/btprint/lineup/hfbt.html on Aug. 26, 2013.
"G200 BT/Epoxy Laminate and Prepreg", Isola Laminate Systems Corp., Data Sheet #5027/3/01, pp. 1-2, 1999.
"LTM2881 Complete Isolated RS485/RS422 uModule Transceiver + Power", Linear Technology Corporation, LT0213 Rev F, pp. 1-24, 2009.
David Krakauer, "Anatomy of a Digital Isolator", Analog Devices, Inc., Technical Article MS-2234, pp. 1-3, Oct. 2011.

* cited by examiner

*Primary Examiner* — Quoc Hoang
(74) *Attorney, Agent, or Firm* — Steven A. Shaw; Frank D. Cimino (57) ABSTRACT

A semiconductor package is provided that has a transformer formed within a multilayer dielectric laminate substrate. The transformer has a first inductor coil formed in one or more dielectric laminate layers of the substrate, a second inductor coil formed in one or more dielectric laminate layers of the substrate, and an isolation barrier comprising two or more dielectric laminate layers of the multilayer substrate positioned between the first inductor coil and the second inductor coil. The transformer may be mounted on a lead frame along with one or more integrated circuits and molded into a packaged isolation device.

15 Claims, 6 Drawing Sheets

MULTILAYER HIGH VOLTAGE ISOLATION BARRIER IN AN INTEGRATED CIRCUIT

FIELD OF THE INVENTION

This invention generally relates to integrated circuits that provide galvanic isolation between two electrical domains while being able to withstand high voltages in the range of multiple kilovolts (kV)

BACKGROUND OF THE INVENTION

Galvanic isolation is a principle of isolating functional sections of electrical systems to prevent current flow between the sections. In order to provide galvanic isolation, no direct conduction path is permitted. Energy or information may still be exchanged between the sections by other means, such as capacitance, induction or electromagnetic waves, or by optical, acoustic or mechanical means.

Galvanic isolation is used where two or more electric circuits must communicate, but their grounds may be at different potentials. It is an effective method of breaking ground loops by preventing unwanted current from flowing between two units sharing a ground conductor. Galvanic isolation is also used for safety, preventing accidental current from reaching ground through a person's body.

For years, designers of industrial, medical, and other isolated systems had limited options when implementing safety isolation; the only reasonable choice was the optocoupler. Today, digital isolators offer advantages in performance, size, cost, power efficiency, and integration. Isolation imposes constraints such as delays, power consumption, cost, and size. A digital isolator's goal is to meet safety requirements while minimizing incurred penalties.

Optocouplers, a traditional isolator, incur the greatest penalties, consuming high levels of power and typically limiting data rates to below 1 Mbps. More power efficient and higher speed optocouplers are available but impose a higher cost penalty.

Digital isolators have now been available for a number of years and reduce the penalties associated with optocouplers. They may be packaged in a single integrated circuit package and may use CMOS based circuitry to offer significant cost and power savings while significantly improving data rates. Digital isolators typically use foundry CMOS processes and may be limited to materials commonly used in foundries. Nonstandard materials complicate production, resulting in poor manufacturability and higher costs. Common insulating materials include polymers such as polyimide (PI), which can be spun onto a silicon substrate as a thin film, and silicon dioxide (SiO2). Both have well known insulating properties and have been used in standard semiconductor processing for years.

Polymers have been the basis for many digital isolators, giving them an established history as a high voltage insulator. For example, a transformer may be implemented using patterned metal layers on a silicon substrate with polyimide or SiO2 insulation between the metal layers. Current pulses in a primary coil on one layer create magnetic fields to induce current on a secondary coil on a second layer. Similarly, a capacitor may be implemented with thin SiO2 isolation barrier and use capacitive electric fields to couple across the isolation barrier. These types of devices have typically been limited to about 400 V isolation working voltage.

A printed circuit board (PCB) implementation may provide coil windings designed within a PCB layer. These implantations typically have a large footprint and PCB dielectrics may be degraded with moisture conditions, thus limiting isolation barrier capability.

Discrete coil wound transformers are bulky and typically have a high cost. A typical discrete coil wound transformer may provide up to approximately 2.5 kV isolation voltage barrier.

High pressure laminate may be used to provide an insulation barrier between coils of a transformer. A typical laminate based signal transformer may be limited to about 2.5 KV isolation voltage breakdown.

BRIEF DESCRIPTION OF THE DRAWINGS

Particular embodiments in accordance with the invention will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

It has now been discovered that an isolation device can be made with a higher isolation voltage by using multiple layers of high pressure laminate as the insulating barrier between a primary coil and a secondary coil of an isolation transformer. Various embodiments will be described in more detail below. An isolation device may be packaged in single multi-chip integrated circuit package that contains one or more integrated circuits and a multilayer laminate isolation transformer all mounted to a single lead frame.

Figure 1:
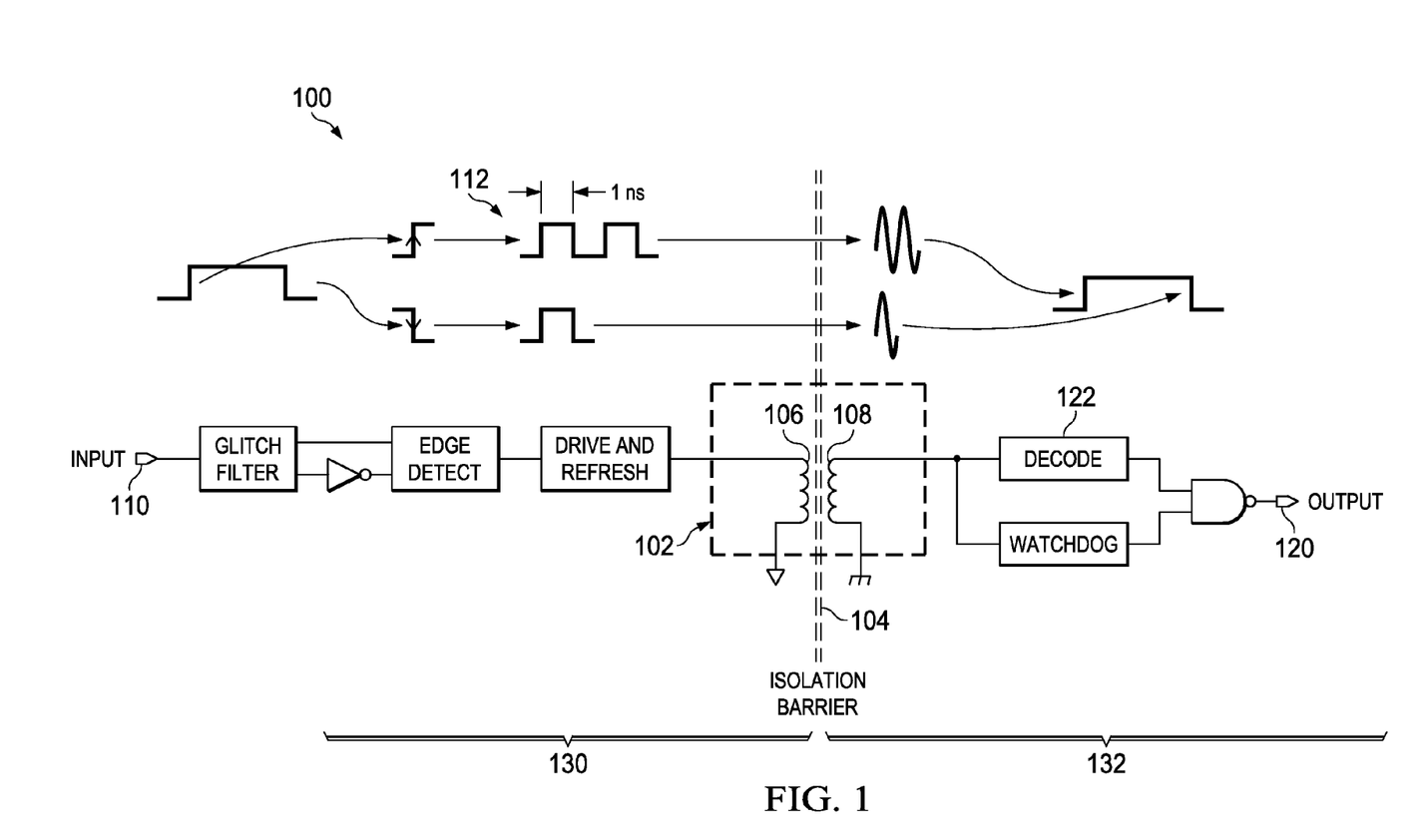
FIG. 1 is a block diagram of a digital isolator that embodies an aspect of the present invention.

FIG. 1 is a block diagram of a digital isolator 100 that embodies an aspect of the present invention. In this example, a signal isolation transformer 102 has a primary coil 106 separated from a secondary coil 108 by a dielectric barrier 104. In this manner, voltage and current in domain 130 are completely isolated from voltage and current in domain 132.

The construction of signal isolation transformer 102 will be described in more detail below.

A signal 110 may be received by digital isolator 100 and filtered. Edge detection circuitry may be used to detect each rising and falling edge and to encode the detected edges into pulses, as indicated at 112. These pulses may then be transferred across isolation transformer 102 and then decoded by decode circuitry 122 to form an output signal 120 that reproduces the input signal. Decode circuitry 122 may be implemented using a delta-sigma analog to digital converter, for example, or by using other known signal processing techniques.

Digital isolator 100 may be configured to transfer signals conforming to the RS-232, RS-485 or RS-422 standards, for example, by providing appropriate encoding and decoding logic and appropriate input and output circuitry. Digital isolator 100 may be configured to transfer other known or later developed signaling standards by providing appropriate receiver and transmitter circuitry and appropriate encoding and decoding logic, for example.

Figure 2:
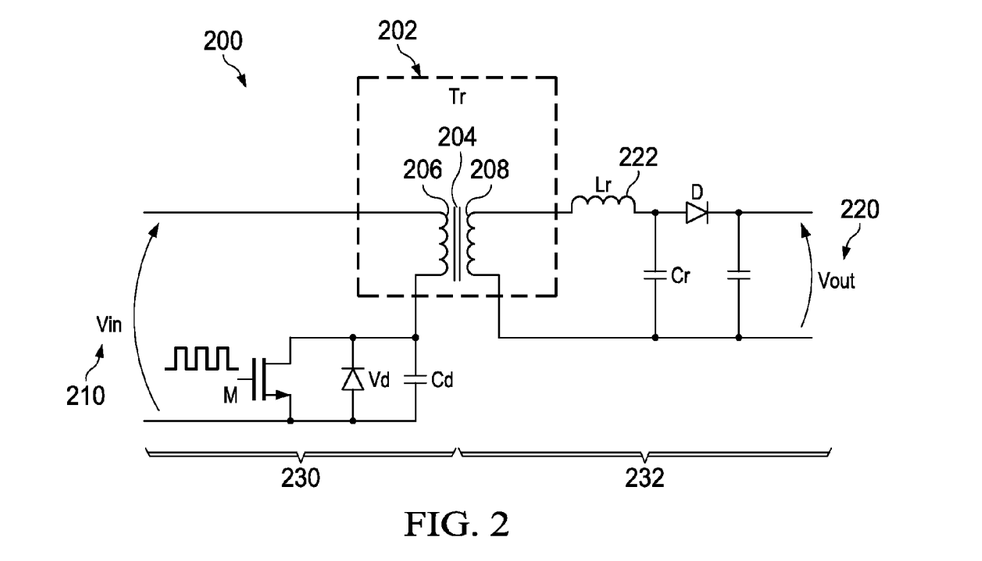
FIG. 2 is schematic of a simple power supply with an isolation transformer that embodies an aspect of the present invention.

FIG. 2 is schematic of a simple power supply 200 with an isolation transformer 202 that embodies an aspect of the present invention. In this example, a power isolation transformer 202 has a primary coil 206 separated from a secondary coil 208 by a multilayer dielectric barrier 204. An input voltage 210 may be provided to power isolation transformer 202 and applied to coil 206. It will be magnetically coupled to coil 208. In this example, a boost coil 222 forms a resonant tank that increases the output voltage 220. In this manner, voltage and current in domain 230 are completely isolated from voltage and current in domain 232. The construction of power isolation transformer 202 will be described in more detail below.

As signal and power isolation transformers are used in more applications, it is desirable to provide larger isolation voltage capabilities. As mentioned earlier, currently known digital isolation devices are only capable of providing up to approximately 2.5 kV isolation. There now exists a need for isolation ratings of 5 kV, or more.

Figure 3:
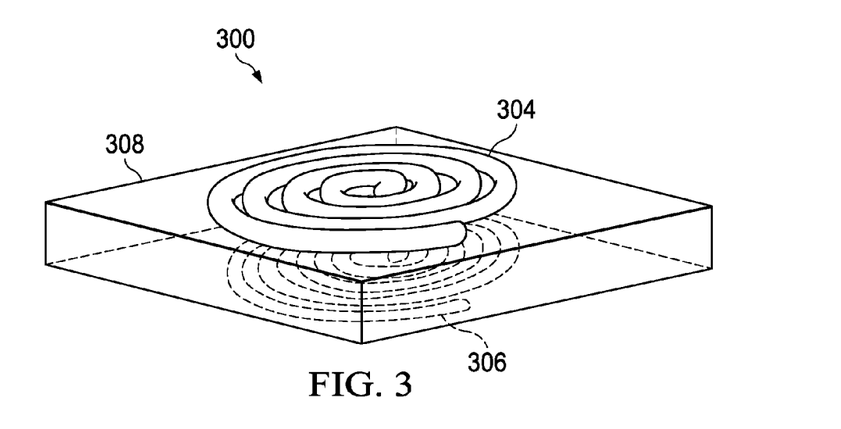
FIG. 3 is an isometric view of the coils of an isolation transformer.

FIG. 3 is an isometric view of the coils of an example isolation transformer 300. In order to package an isolation transformer in a small integrated circuit package, two essentially flat spiral coils 304 and 306 are formed on a substrate separated by an isolation barrier 308. As discussed above, prior isolation transformers have been implemented on a silicon substrate with a polyimide isolation barrier, or on a printed circuit board, for example.

Figure 4:
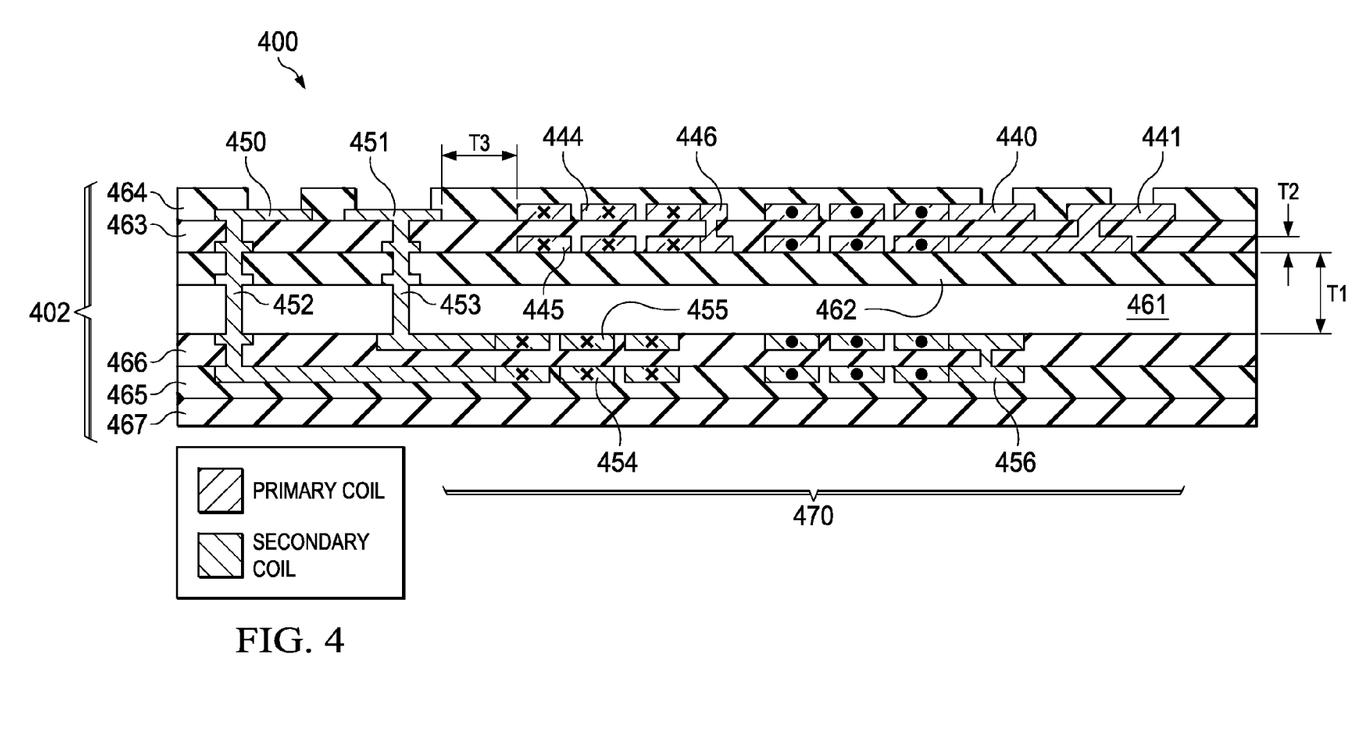
FIG. 4 is a cross section of an example isolation transformer that uses multiple dielectric layers for isolation.

FIG. 4 is a cross section of an example isolation transformer 400 that uses multiple dielectric layers for isolation. Transformer 400 is formed in a multilayer laminate substrate 402 It has now been discovered that by using multiple layers of a high pressure laminate material to isolate the primary and secondary coils of isolation transformer 400, a higher voltage breakdown value can be obtained. In this example, two laminate layers 461, 462 are used to create a combined thickness T1 between primary spiral coil 445 and a secondary spiral coil 455. Testing has shown that multiple layers of laminate have a higher voltage breakdown than a single layer having a same thickness T1.

In this example, laminate layers 461, 462 are laminate materials that include Bismaleimide Triazine (BT) and that have a high breakdown strength of 100-120V/um. Such material may be obtained from Mitsubishi Gas Chemical (MGC) as copper clad laminates and prepregs, such as vendor number HLxxxxx series material, for example. However, in other embodiments, different types of laminate material may be used, such as ABF (Ajinomoto Buildup Films) material.

BT-Epoxy is mixture of epoxy resin and BT resins. BT stands for Bismaleimide-Triazine resin. This is in turn a mixture of bismaleimide and cyanate ester. Three cyano groups of the cyanate ester are trimerized to a triazine ring structure, hence the T in the name. In presence of a bismaleimide the double bond of the maleimide group can copolymerize with the cyano groups to heterocyclic 6-membered aromatic ring structures with two nitrogen atoms (pyrimidines). The cure reaction occurs at temperatures up to 250 degrees C., and is catalyzed by strongly basic molecules like Dabco (diazabicyclooctane) and 4-DMAP (4-dimethylaminopyridin). Products with very high glass transition temperatures (Tg)—up to 300 degrees C.—and very low dielectric constant can be obtained. These properties make these materials very attractive for use in PCBs.

In this example, the BT laminate material is halogen free. These halogen free materials achieve a flammability rating of UL94V-0 without using halogens, antimony, or phosphorus compound. The substitution of an inorganic filler as the flame retardant has the additional benefits of improving the small hole $CO_2$ laser drilling properties, and lowering the CTE (coefficient of thermal expansion).

Prepreg is the common term for a reinforcing fabric which has been pre-impregnated with a resin system. This resin system, typically epoxy, includes the proper curing agent. As a result, the prepreg is ready to use without the addition of more resin. The laminate is cured by a combination of heat and pressure.

In this example, the first layer 461 of the isolation barrier is a copper clad laminate layer, while the second layer 462 is a prepreg layer. A total thickness T1 is approximately 110 um in this example. No metal is allowed in the region 470 that is under and between the spiral coils in order to reduce the chance of voltage breakdown. Testing has verified that the isolation barrier can withstand a voltage in excess of 6 kV between primary coil 445 and secondary coil 455.

In the example transformer 400, there are two coils 444, 445 in prepreg layers 463, 464 coupled by via 446 in the first coil, and two coils 454, 455 in prepreg layers 465, 466 coupled by blind via 456 in the second coil. This allows a greater amount of magnetic field in a same footprint, thus increase the magnetizing inductance.

In order to connect leads to the transformer, terminal pads 440 and 441 are coupled to the primary coil; terminal pads 450 and 451 are coupled to the secondary coil. Terminal pad 441 is coupled to the first coil by a blind via. Similarly, terminal pad 450 is coupled to coil 454 by blind via 452 and terminal pad 451 is coupled to coil 455 by blind via 453. Placing all of the terminals on the top of the structure 400 allows for easier lead connections. A blind via is a copper plated hole, just like a regular via, except that it interconnects only one external layer of the PCB with one or more internal layers, but does not go all the way through the board. A buried via is a copper plated hole that interconnects one or more internal layers, but does not connect to an external layer, hence the hole is completely internal or buried within the board. The use of blind vias and buried vias eliminate the potential for arcing caused by metallic whiskers that may be formed during drilling of the vias. The fabrication of blind vias and buried vias use known via drill technology.

Vias 450, 451 are spaced apart from the first coil by a distance T3 to assure that voltage arcing does not occur between the vias and the first coil. Distance T3 is approximately 250 um in this example.

Each prepreg layer 463, 464, 465, 466 has a thickness, such as thickness T2. Typically T2 will be in the range of 30-70 um. This allows the copper that forms coils 444, 445, 454, 455 to be much thicker then the metal used in prior digital isolation devices that are formed on a silicon substrate. This allows larger current flows to be handled for power and signal applications. Transformer performance (quality factor, efficiency) may thereby be optimized by using copper thickness of 12 um-30 um and multiple metal layers (2-8) to allow parallel inductor coils, lower coil resistance, shield layers.

Figure 5:
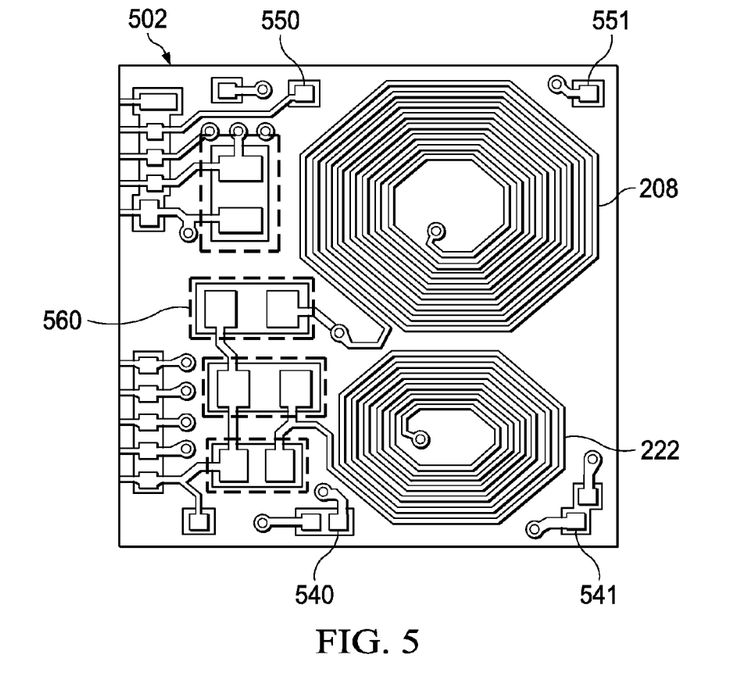
FIG. 5 is a top view of the layout of the power supply of FIG. 2.

FIG. 5 is a top view of the layout of the power supply of FIG. 2. In this example, multilayer substrate 502 is constructed in a similar manner as substrate 402 of FIG. 4. Terminals 550, 551 couple to primary coil 206 using buried and blind vias, which are below coil 208 and not visible in this figure. An input voltage Vin 210 is provided on these terminals. Output terminals 540, 541 provide an output voltage Vout 220 and couple to secondary spiral coil 208 and resonant coil 222 using buried and blind vias and printed traces.

Various passive components such as capacitors Cd and Cr, diode D and control transistor M, referring again to FIG. 2, may be mounted on laminate substrate 502 at the locations generally indicated, such as 560, for example.

Figure 6:
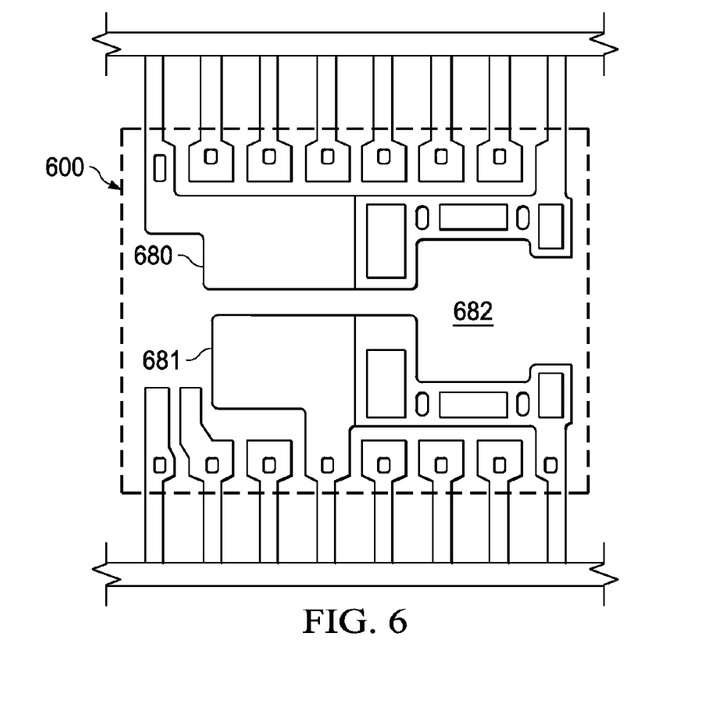
FIG. 6 is a plan view of a lead frame for an example isolation device.

FIG. 6 is a plan view of a lead frame 600 for an example isolation device. In this example, a die attach pad (DAP) is split into two separate portions 680, 681 so that no galvanic connection exists between an input side and an output side of the isolation device. An input circuit integrated circuit (IC) that provides input circuitry and encoding logic may be mounted on DAP portion 680 and an output IC that provides decoding logic and output circuitry may be mounted on DAP portion 681. An isolation transformer may be mounted to the lead frame DAP in a manner that spans DAP 680 and 681. Note that there is a large region 682 in which no metal is allowed. This is the region that is below the isolation transformer spiral coils. Region 682 in which no metal is allowed is also beneficial in increasing transformer quality factor by reducing the image current that usually oppose to the magnetic field generated by the coil.

During manufacture, various layers of laminate may be patterned using known etching technology and then assembled into a multilayer substrate by applying pressure and an elevated temperature, using known manufacturing techniques. At this point, multiple isolation transformers are formed on a strip of laminate substrate. The passive components may be mounted on the laminate substrate while it is in strip form and then the strip may be singulated to form the individual isolation transformer substrates. A pick and place operation may then place the laminate substrate and input and output IC's on lead frame 600 using known pick and place technology.

Figure 7:
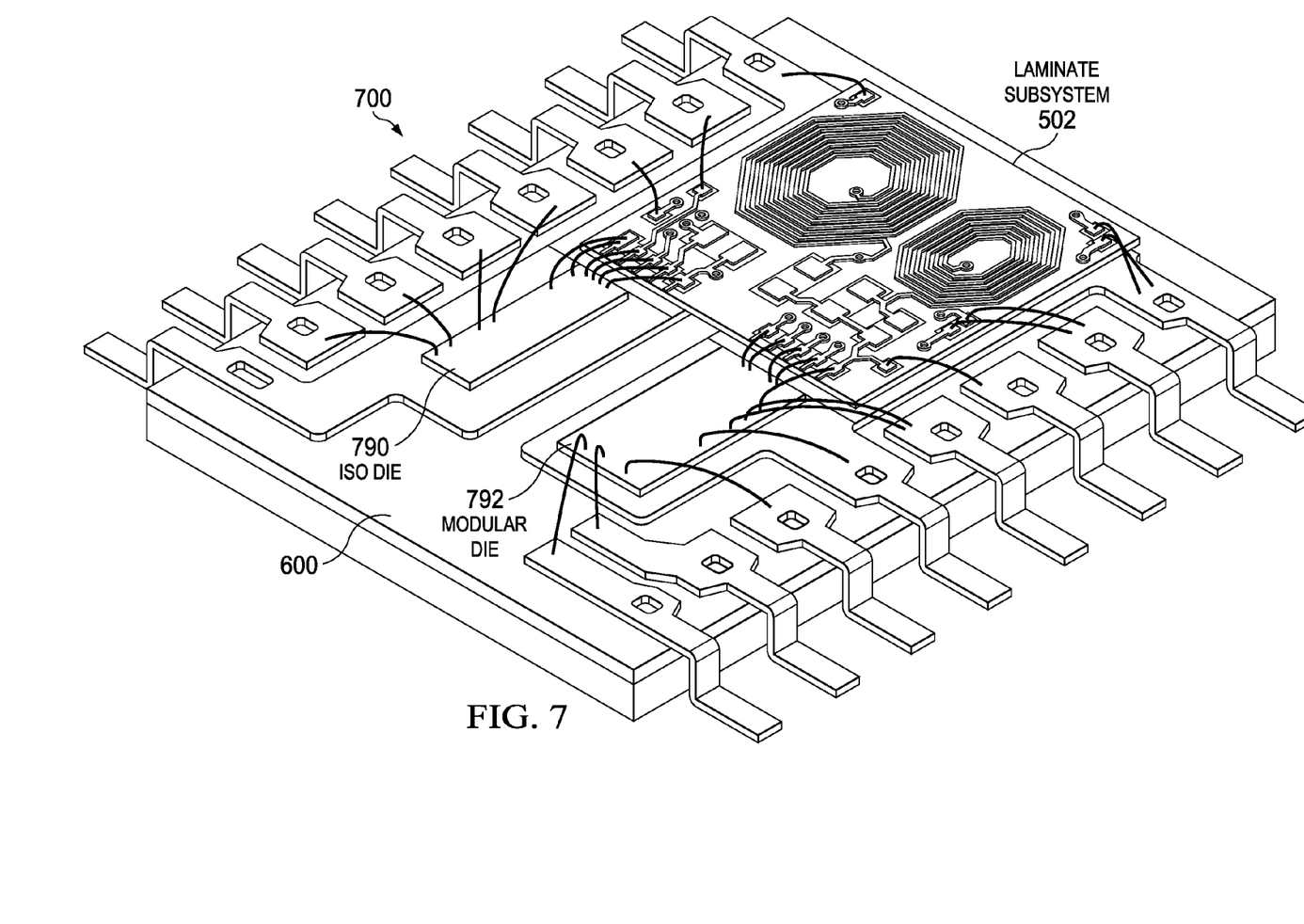
FIG. 7 is an isometric view of a completely packaged isolation device.

FIG. 7 is an isometric view of a completely packaged isolation device 700. In this example, isolation transformer substrate 502 is mounted on lead frame 600, along with an input IC 790 and an output IC 792. The entire multichip assembly is then molded with a molding compound to totally encapsulate and protect the isolation device. The general technique of mounting IC's on a lead frame and encapsulation is well known and need not be described in further detail herein. In this manner, at least one layer of prepreg material or mold compound separates the isolation device from the environment.

Testing has demonstrated that device 700 can provide 6 kVrms isolation withstand voltage, 12 kV surge isolation voltage, and 1 kVrms working voltage.

Figure 8A:
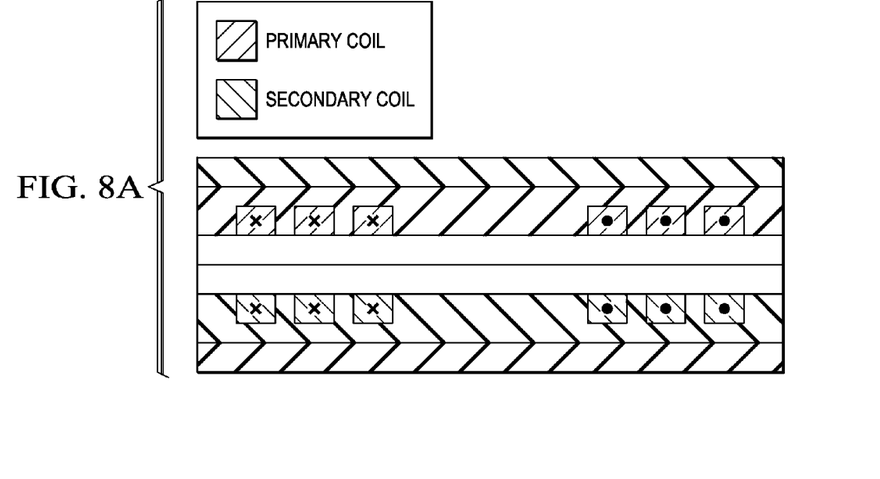
FIGS. 8A-8B are cross-sectional views of examples of various isolation transformer coil configurations.
Figure 8B:
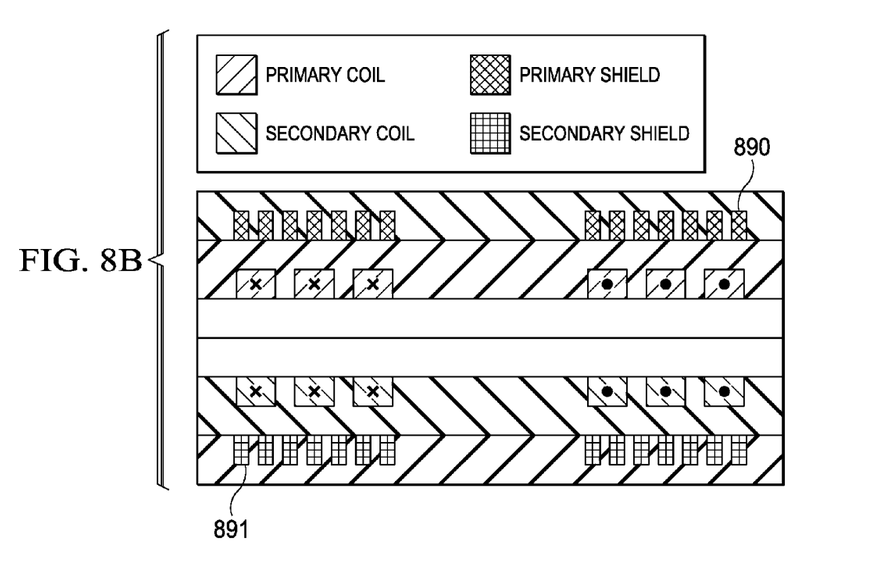

FIGS. 8A-8B are cross-sectional views of examples of various isolation transformer coil configurations. FIG. 8A illustrates a single layer used for each spiral coil, while FIG. 8B illustrates a primary shield layer 890 and a secondary shield layer 891. Shield layers 890, 891 are typically connected to respective ground potential nets.

Various embodiments may provide a platform technology to enable integrated solutions for isolated power and signal transfer with robust high voltage isolation in a low cost device by leveraging existing laminate technology and manufacturing infrastructure. The multilayer isolation barrier separation has a large DTI (distance through insulation) and hence reduced electrical stress/field density in barrier dielectrics. Multi-layer structures optimize transformer performance. Cost is reduced by replacing an expensive carrier like silicon wafer with an inexpensive BT multilayer laminate.

OTHER EMBODIMENTS

While the invention has been described with reference to illustrative embodiments, this description is not intended to be construed in a limiting sense. Various other embodiments of the invention will be apparent to persons skilled in the art upon reference to the description herein.

While multilayer BT laminate was described herein, other types of laminate may be used, such as ABF and other industry standard laminate materials.

While two layers of laminate were illustrated herein as an isolation barrier, other embodiments may use three or more layers.

While two integrated circuits combined with a single transformer in one molded package were illustrated herein, other embodiments may be more complex. For example, there may be one isolation transformer for power and a second isolation transformer for a signal, for example. There may be multiple signal isolation transformers included in a single molded package for multiple signals, for example.

While a sixteen pin lead frame was illustrated herein, other embodiments may use lead frames having more, or fewer, pins.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

It is therefore contemplated that the appended claims will cover any such modifications of the embodiments as fall within the true scope and spirit of the invention.

What is claimed is:

1. A semiconductor package comprising:
a transformer formed within a multilayer dielectric laminate substrate, wherein the transformer comprises:
a first inductor coil formed in one or more dielectric laminate layers of the substrate;
a second inductor coil formed in one or more dielectric laminate layers of the multilayer substrate; and
an isolation barrier comprising two or more dielectric laminate layers as inner layers of the substrate comprising Bismaleimide Triazine (BT) positioned between the first inductor coil and the second inductor coil.

2. The semiconductor package of claim 1, further comprising:
   a first set of terminals formed in a top dielectric laminate layer of the substrate coupled to the first inductor coil; and
   a second set of terminals formed in the top dielectric laminate of the substrate coupled to the second inductor coil by a set of vias that are contained within the inner layers, wherein each via of the set of vias comprise blind or buried vias, whereby voltage breakdown is maximized.

3. The semiconductor package of claim 2, further comprising:
   a metal leadframe having a split die attachment pad (DAP) configured to support the transformer; and
   a first integrated circuit (IC) mounted on a portion of the split DAP.

4. The semiconductor package of claim 3, further comprising a second integrated circuit mounted on a separate portion of the split DAP.

5. The semiconductor package of claim 3, further comprising mold compound that encapsulates the transformer and the first IC.

6. The semiconductor package of claim 3, wherein the inductor coil placement is constrained to avoid electromagnetic interference from the leadframe metal.

7. The semiconductor package of claim 2, wherein the leadframe is constrained to not have any metal in proximity to the first inductor coil or to the second inductor coil.

8. The transformer of claim 1, wherein the first inductor coil and the second inductor coil are constrained to be not present on a plurality of bottom-most metal layers closest to a leadframe die attachment pad DAP.

9. A semiconductor package comprising:
   a transformer formed within a multilayer dielectric laminate substrate, wherein the transformer comprises:
   a first inductor coil formed in one or more dielectric laminate layers of the substrate;
   a second inductor coil formed in one or more dielectric laminate layers of the multilayer substrate; and
   an isolation barrier comprising two or more dielectric laminate layers of the substrate positioned between the first inductor coil and the second inductor con, wherein the first inductor coil has a thickness greater than 12 um.

10. A semiconductor package comprising:
    a leadframe having a split die attachment pad (DAP);
    a first integrated circuit (IC) mounted on a first portion of the split DAP; and
    an isolation transformer mounted to span the split DAP, wherein the transformer comprises a multilayer dielectric laminate substrate, wherein the transformer has a multilayer laminate isolation barrier of Bismaleimide Triazine (BT).

11. The semiconductor package of claim 10, further comprising a second integrated circuit mounted on a separate portion of the split DAP.

12. The semiconductor package of claim 10, further comprising mold compound that encapsulates the transformer and the first IC.

13. The semiconductor package of claim 10, wherein the transformer comprises:
    a first inductor coil formed in one or more dielectric laminate layers of the substrate;
    a second inductor coil formed in one or more dielectric laminate layers of the multilayer substrate; and
    wherein the isolation barrier comprises two or more dielectric laminate layers of the substrate positioned between the first inductor coil and the second inductor coil.

14. The semiconductor package of claim 13, wherein the leadframe is constrained to not have any metal in proximity to the first inductor coil or to the second inductor coil.

15. The semiconductor package of claim 13, further comprising:
    a set of vias coupling the portions of the split DAP wherein each via of the set of vias comprise blind or buried vias that are contained within the inner layers of the isolation barrier, whereby voltage breakdown is maximized.

* * * * *